United States Patent [19]

Cohen

[11] Patent Number: 4,622,262

[45] Date of Patent: Nov. 11, 1986

[54] RECORDING MATERIALS OF IMPROVED LUBRICITY FOR USE IN ELECTROEROSION PRINTING

[75] Inventor: Mitchell S. Cohen, Ossining, N.Y.

[73] Assignee: International Business Machines Corporation, Armonk, N.Y.

[21] Appl. No.: 830,023

[22] Filed: Feb. 14, 1986

Related U.S. Application Data

[63] Continuation of Ser. No. 747,688, Jun. 24, 1985, abandoned, which is a continuation of Ser. No. 454,744, Dec. 30, 1982, abandoned.

[51] Int. Cl.⁴ .................. G01D 15/34; B32B 7/00
[52] U.S. Cl. ................. 428/219; 346/135.1; 428/323; 428/336; 428/339
[58] Field of Search ............ 428/209, 423.7, 425.1, 428/219, 323, 336, 339; 427/121; 346/135.1, 162, 163

[56] References Cited

U.S. PATENT DOCUMENTS

| | | | |
|---|---|---|---|
| 3,411,948 | 11/1968 | Reis | 117/217 |
| 3,514,325 | 5/1970 | Davis et al. | 428/457 |
| 4,086,853 | 2/1978 | Figor | 101/463 |
| 4,248,950 | 2/1981 | Westdale et al. | 430/31 |
| 4,384,012 | 5/1983 | Huisman et al. | 427/130 |
| 4,439,485 | 3/1984 | Takemura et al. | 428/323 |

FOREIGN PATENT DOCUMENTS

| | | |
|---|---|---|
| 1496152 | 8/1973 | Fed. Rep. of Germany . |
| 2434105 | 1/1976 | Fed. Rep. of Germany . |
| 2333406 | 9/1977 | France . |
| 16653 | 6/1975 | Japan . |
| 13746 | 4/1977 | Japan . |
| 54-38 | 2/1980 | Japan . |
| 1244177 | 8/1971 | United Kingdom . |
| 1545726 | 5/1979 | United Kingdom . |

Primary Examiner—George F. Lesmes
Assistant Examiner—William M. Atkinson
Attorney, Agent, or Firm—Jackson E. Stanland

[57] ABSTRACT

Electroerosion recording materials are provided with a surface lubricant film of lubricating conductive material in a polymeric binder. The lubricating conductive agent reduces stylus scratching of the conductive layer during electroerosion printing, improves contrast, provides a beneficial coating on the writing electrode or stylus and improves the handling and writing characteristics of the recording material. The lubricating conductive agent/polymer films are especially useful where the substrate of the recording material is light transmissive and, after the electroerosion process, the resulting product is suitable for direct-negative applications.

6 Claims, 2 Drawing Figures

RECORDING MATERIALS OF IMPROVED LUBRICITY FOR USE IN ELECTROEROSION PRINTING

This application is a continuation of application Ser. No. 747,688, filed June 24, 1985, now abandoned, which is a continuation of Application Ser. No. 454,744, filed Dec. 30, 1982, now abandoned.

DESCRIPTION

1. Technical Field

The invention relates to electroerosion printing and to recording materials exhibiting improved lubricity for use in such processes, and especially for use in direct-photonegative applications.

Electroerosion printing is a well-known technique for producing markings such as, letters, numbers, symbols, patterns such as circuit patterns, or other legible or coded indicia on recording material in response to an electric signal which removes or erodes material from the surface of the recording material as the result of spark initiation.

The surface which is eroded or removed to provide such indicia on the recording material is usually a thin film of conductive material which is vaporized in response to localized heating associated with sparking (arcing) initiated by applying an electric current to an electrode in contact with the surface of a recording material comprising the thin conductive film on a non-conductive backing or support. In the present state of the technology the thin conductive film is usually a thin film of vaporizable metal, such as, aluminum.

Electroerosion printing is effected by the movement of a stylus or a plurality of styli relative to the surface of specially prepared recording media. Electrical writing signals are fed to the stylus to provide controlled electrical pulses which generate sparks at the surface of the recording material to selectively heat and remove by evaporation a layer of the recording material; the locations from which material is removed correspond to the indicia or images which are to be recorded.

In the course of this process, the stylus is moved relatively to a surface of the recording material and in contact with the removable layer, e.g., a thin film of vaporizable material, usually a metal, such as, aluminum.

2. Prior Art

Due to the fragility of the thin conductive layer and stylus pressure, considerable scratching (undesired removal of the removable layer) is observed to take place during electroerosion printing.

It has been recognized for some time, therefore, that the use of a lubricant and/or protective overcoat on the surface of such electroerosion recording material would be helpful to reduce scratching by the stylus. After some investigation, lubricants comprising long chain fatty acids were adopted. Even with the use of such lubricants, however, some stylus scratching of the thin aluminum film of electroerosion recording materials continues to be observed. Therefore, efforts continued to be directed to finding a superior lubricant - protective layer composition for the surface of electroerosion recording materials.

Aside from the above-mentioned use of long chain fatty acid lubricants, no prior art is known which discloses the use of such overlayers on the surface of electroerosion recording media to reduce stylus scratching.

Among the prior disclosures relevant to electroerosion printing, U.S. Pat. No. 2,983,220, Dalton et al, discloses a lithographic coating on an electroerosion recording sheet; the coating may be a copolymer containing zinc oxide and zinc sulfide. An internal layer containing conductive material, such as, graphite, is disclosed in U.S. Pat. No. 3,048,515, Dalton. An electroresponsive recording blank having a removable masking layer containing a luminescent material is described in U.S. Pat. No. 2,554,017, Dalton. Other prior art providing further general background in the field of electroerosion printing includes U.S. Pat. Nos. 3,138,547, Clark and 3,411,948, Reis. High temperature lubricants comprising graphite in oil are also known, as is disclosed in U.S. Pat. No. 3,242,075, Hunter.

SUMMARY OF THE INVENTION

It has been found that improved electroerosion recording materials can be prepared by applying to the surface of such materials a layer of lubricating conductive material in a polymeric binder. The general class of laminar solids may be employed as such lubricating conducting agents. Examples of such solids are $MoS_2$, $WS_2$, $VSe_2$, $TaSe_2$, $TaS_2$ and graphite. Other soft compounds may be considered such as $AgI$, $PbO$, $Pb(OH)_2$, $PbCO_3$, $CaF_2PbO$ since they have all been shown to be lubricants. In addition, soft metal particles such as Sn, Cu, Zn, Ag, Pb, Au, Bi and Al are expected to be useful in the invention. Work has been carried out with $MoS_2$, Al, and Zn, but the most satisfactory results have been obtained with graphite since it is cheap, effective, and easy to disperse. The overlayers of lubricating conductive materials in polymeric binder may be applied directly to the surface of electroerosion recording materials.

One object of the invention, therefore, is to produce electroerosion recording materials of improved resistance to stylus scratching by use of the special lubricating coatings of this invention.

Another object of the invention is to provide a superior lubricant composition which also exhibits improved contrast when used to produce direct-negatives by electroerosion printing. In such usage the dark graphite/polymer film serves to help block light that may be partially transmitted through the thin conductive film, e.g., a thin aluminum film.

The materials incorporated in the recording materials of this invention also have the advantage of coating the recording styli with a light, fluffy, easily removable layer because of their high lubricity. This layer inhibits the build-up of organic residue layers which could cause fouling of "baking" of debris onto the styli which in turn prevents good writing.

Another advantage of the lubricating layers of this invention is that they are electrically conductive and therefore can be used in thicker layers than can insulating lubricant films. The conductivity provided by the graphite appears to enhance the dielectric breakdown through the overlayer.

Further, the lubricants of this invention may be incorporated in a layer which provides both protection to the recording sheet during handling and lubrication during the electroerosion process.

DETAILED DESCRIPTION OF THE PREFERRED EMBODIMENT OF THE INVENTION

The present invention generally comprises electroerosion recording materials coated, on their stylus contacting surface, with a lubricant composition comprising lubricating particles of good electric conductivity in a polymeric binder. Electroerosion materials for use as direct-negative or direct masters can be prepared utilizing this invention. In general the lubricating layer should have a density between about 5 and 50 micrograms per square centimeter since lower concentrations give inadequate lubrication and higher concentrations are too thick for good writing at low writing voltages (about 50 V) and short pulse lengths (about 20 microseconds). If more energy is applied by increasing the voltage of the writing pulse and increasing the pulse length, thicker films can be used. Also the lubricating agent; binder ratio should be adjusted to avoid flakeoff of the lubricating agent.

Any conductive laminar solid may be used as the conductive agent for the lubricating layer. Graphite is preferred and $MoS_2$, Al and Zn have been demonstrated. Other materials which are expected to be useful include, for example, $WS_2$, $VSe_2$, $TaSe_2$, AgI, PbO, $Pb(OH_2)$, $PbCO_3$, $CaF_2PbO$, Sn, Cu, Ag, Pb, Au, Bi, etc.

Any film forming polymer which is compatible with and capable of dispersing the lubricating conductive agent and which does not cause stylus fouling during electroerosion printing can be used as the binder in the compoition of this invention.

Figure 1:
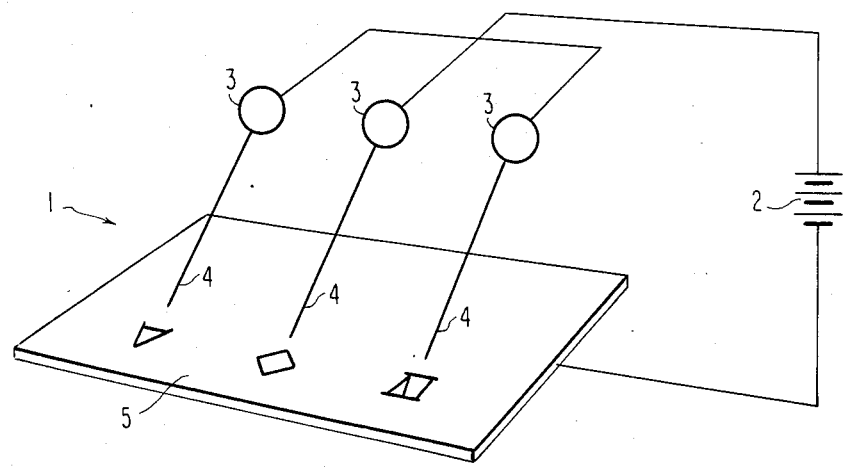
FIG. 1 of the drawings is a general schematic rendering of an illustrative electroerosion printing system.

The detailed description of the invention can be better appreciated by reference to the accompanying drawings. FIG. 1 illustrates schematically an electroerosion printing system 1 which includes a source of electrical energy 2, which is connected with writing control means 3 for controlling the flow (voltage and pulse length) of electrical current to styli 4 which are electrodes which contact the surface of the electroerosion recording material 5.

In operation, electric current pulses corresponding to information to be printed on the recording material 5 are transmitted through the writing control systems 3 to the styli 4. As a result, electrical discharges are generated at the surface of the recording material 5, and the temperature of the thin surface film is locally raised causing evaporation of the surface film or layer and exposing the underlying material to produce the desired image.

Means (not shown) are provided for moving the styli 4 relative to and in contact with the surface of the recording material 5. As the styli 4 move relative to the recording material 5 and the writing control means 3 direct pulses of current to the styli of sufficient voltage to cause arcing and evaporation of a conductive layer of the material, there can be recorded desired information, patterns and graphics of any kind. It is during the movement of the styli over and in contact with the surface of the recording material that the thin film on the surface of the recording material is liable to be scratched and abraded resulting in poor writing quality and perhaps the recording of erroneous information.

Figure 2:
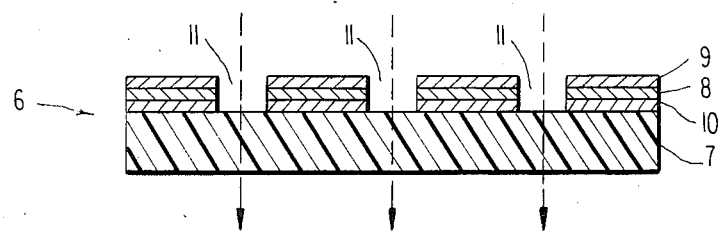
FIG. 2 of the drawings is a cross-sectional view of a sheet of electroerosion material made in accordance with this invention and showing the removal of surface layers in regions where electroerosion has been effected.

Referring to FIG. 2, the electroerosion recording material of this invention 6 is shown in cross section to comprise a support 7 of paper, polymer film, etc., a thin, conductive, evaporable layer or film 8, and a lubricant layer or film 9; optionally a tough, hard, transparent film 10 may be positioned between the support 7 and the evaporable layer 8. This film which preferably is of a cross-linked polymer and which may be light transmissive or transparent serves further to reduce scratching of the material during electroerosion printing. The evaporable film 8 usually has a resistance of from about 1 to 5 ohms per square and is frequently a vapor-deposited thin film of aluminum.

Where the backing or support is a light transparent or transmissive material, the resulting product can be used as a photomask or direct-negative medium for the development of photosensitive materials, e.g., in the production of offset lithography masters, circuit boards, etc. Where the styli have been energized and the lubricant film and conductive film burned off light windows 11 are provided through the transparent backing so that the material is rendered selectively light (arrows) transmissive and may then be used in direct-photonegative or like applications.

Where the material is to be used as an offset master the support should be chosen to be an ink receptive material such as polyester. After imaging by electroerosion printing to expose the support layer selectively, the overlayer of lubricating composition is removed, for example, by applying a solvent for the polymeric binder. This exposes the conductive layer which must be ink repellent. Aluminum is the commonly used material for the conductive layer and carries a thin aluminum oxide surface film which is inherently hydrophilic, i.e., repellent to oil based inks.

Electroerosion recording materials of the invention may be prepared in accordance with the following procedure:

As a support, a sheet of polyester 50 micrometers thick was provided. On this support, using conventional web-coating apparatus, a coating of silica particles in a crosslinked CAB binder was put down, as is described in copending U.S. patent application Ser. No. 454,743 filed Dec. 30, 1982. Onto this layer there was evaporation deposited, by conventional technique, a thin conductive film of aluminum, about 20 mm thick.

Finally, using conventional web-coating apparatus a lubricating film was coated onto the dielectric layer.

The coating from which the lubricating layer or film was deposited comprised a solution containing the following ingredients in the indicated approximate percentages by weight:

Graphite—16%
Polymeric Binder—4%
Solvent—80%

To apply this coating it was convenient to make a considerable further dilution of perhaps about 5:1 in additional solvent. A suitable composition for the lubricant has been found to be available commercially as ELECTRO-DAG 154 from Acheson Colloid Co. or similar products from Graphite Products Corp. or Superior Graphite Corp.; ELECTRO-DAG 154 comprises graphite, ethyl cellulose binder and isopropanol solvent in the above proportions. After the coating is applied, only a short drying cycle (about 3 minutes at 100° C.) is needed to drive off the solvent.

Other binders can be used in the lubricant layer such as other cellulosics, e.g., cellulose acetate butyrate, or hydroxy ethyl cellulose, or materials like vinyl acetate, polycarbonate, styrene anhydride (SMA from Arco Co.), various acrylates, and a wide variety of other binders.

It is found that a wide range of binder concentrations can be effectively used, e.g., from about 20% binder to 80% graphite, as offered by vendors, to from about 80% binder to 20% graphite, as can be made by adding additional binder. The binder typically used is cellulose acetate butyrate [CAB 553.4 from Eastman Chemical Corp.] dissolved in an 80%, 20% mixture of methyl ethyl ketone and toluene. The change in binder concentration changes the electrical conductivity of the overlayer. Depending on the details of the driver circuitry of the electroerosion printing system, in particular the maximum initial current which can be delivered by the drivers, it may be advantageous to employ a higher binder content.

It is further noted that the high-binder content materials are fairly transparent, being only grayish in thin layers. Under these circumstances such layers could be used for electroerosion paper, giving reduced scratching in that application.

Another advantage of higher binder content is that there is less tendency of the overlayer to smudge or flake off during handling. It is estimated that about 30% binder and above is satisfactory for this purpose.

It may be noted that in the case of too high binder content, e.g., over about 80% there may be danger of stylus fouling from the debris. Therefore the binder chemistry must be chosen with care; binders with high glass transition temperatures are better in that regard.

The solvent for the lubricating material-binder solids is not critical, as it need only be capable of satisfactorily dissolving the solids to provide a composition compatible with the coating technique which is utilized. Some available graphite-binder solids are provided in isopropanol solvent, while others incorporate trichlorethane and many other solvents are no doubt useful in the invention.

In using materials prepared as described above, writing signals in the range of from about 30 to 60 volts are satisfactory to electroerode the conductive layer of these materials to expose the underlayer.

While this invention has been described in connection with specific embodiments, it will be understood that those of skill in the art may be able to develop variations of the disclosed embodiments without departing from the spirit of the invention or the scope of the following claims.

Having thus described my invention, what I claim as new, and desire to secure by Letters Patent is:

1. An electroerosion recording medium suitable for electroerosion writing of a pattern therein by electrical pulses through a multi-stylus recording head, said pulses having a short duration and having a magnitude less than about 100 volts, including in combination
    a support layer,
    a thin conductive layer capable of being removed in selected areas thereof by said electroerosion writing when said styli contact said thin conductive layer, and
    a lubricating overlayer on the stylus-contacting side of said thin conductive layer, said overlayer being less than 1000 angstroms in thickness and being comprised of solid laminar graphite particles dispersed in a binder wherein said graphite particles are dispersed noncontinuously in a lateral direction of said overlayer.

2. The recording medium of claim 1, where said overlayer has a density in the order of about 5 micrograms per square centimeter.

3. The recording medium of claim 1, where the amount of graphite in said overlayer is about 70-80%, by weight.

4. The recording layer of claim 1, where the amount of graphite in said overlayer is in the range of about 50-80%, by weight.

5. The recording medium of claim 1, where said overlayer has a density in the order of about 5 micrograms per square centimeter, and contains about 50-80% graphite, by weight.

6. An electroerosion recording medium suitable for electroerosion writing of a pattern therein by electrical pulses through a multi-stylus recording head, said pulses having a short duration and having a magnitude less than about 100 volts, including in combination:
    a support layer,
    a thin conductive layer capable of being removed in selected areas thereof by said electroerosion writing when said styli contact said thin conductive layer, and
    a lubricating overlayer on the stylus - contacting side of said thin conductive layer, said overlayer having a density of less than 20 micrograms per square centimeter and a thickness and conductivity such that said thin conductive layer is removed by electrical arcs produced by said electrical pulses, said overlayer being comprised of solid laminar graphite particles dispersed in a binder wherein said graphite particles are dispersed noncontinuously in a lateral direction of said overlayer.

* * * * *